United States Patent
Park

(10) Patent No.: US 7,859,633 B2
(45) Date of Patent: Dec. 28, 2010

(54) MULTI-LAYER FLEXIBLE FILM PACKAGE AND LIQUID CRYSTAL DISPLAY DEVICE INCLUDING THE SAME

(75) Inventor: Joo-hwan Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 11/779,369

(22) Filed: Jul. 18, 2007

(65) Prior Publication Data

US 2008/0024714 A1    Jan. 31, 2008

(30) Foreign Application Priority Data

Jul. 31, 2006    (KR) ...................... 10-2006-0072242

(51) Int. Cl.
*G02F 1/1345* (2006.01)
(52) U.S. Cl. ...................... 349/150; 349/149
(58) Field of Classification Search .............. None
See application file for complete search history.

(56) References Cited

U.S. PATENT DOCUMENTS

| | | | |
|---|---|---|---|
| 6,359,341 B1 * | 3/2002 | Huang et al. ................ 257/778 |
| 6,407,508 B1 * | 6/2002 | Kawada et al. ........... 315/169.3 |
| 6,522,543 B2 * | 2/2003 | Kurihara et al. ............. 361/704 |
| 6,657,620 B2 | 12/2003 | Oishi et al. |
| 7,414,851 B2 * | 8/2008 | You ........................ 361/719 |
| 7,696,614 B2 * | 4/2010 | Fukusako et al. .......... 349/150 |
| 2002/0176236 A1 * | 11/2002 | Iguchi et al. ................ 361/753 |
| 2005/0024573 A1 * | 2/2005 | Suzuki ....................... 349/149 |
| 2006/0040520 A1 * | 2/2006 | Moh ............................. 439/66 |
| 2006/0110949 A1 * | 5/2006 | Jee et al. ...................... 439/64 |
| 2006/0267863 A1 * | 11/2006 | Kim ............................. 345/51 |

FOREIGN PATENT DOCUMENTS

| | | |
|---|---|---|
| CN | 1580889 | 2/2005 |
| JP | 10333173 | 12/1998 |
| KR | 1020050039021 | 4/2005 |

OTHER PUBLICATIONS

Chinese Office Action for application No. 2007101371935 dated Dec. 18, 2009 with English Translation.

* cited by examiner

*Primary Examiner*—Mike Stahl
(74) *Attorney, Agent, or Firm*—Cantor Colburn LLP

(57) ABSTRACT

A multi-layer flexible film package which shields electromagnetic waves, prevents electrostatic discharge, and at the same time, performs a heat radiation function, and a liquid crystal display device having the same, include an insulating film having circuit patterns and internal ground wiring lines at a first side thereof, an insulating layer formed on the circuit patterns and the internal ground wiring lines, a driver integrated circuit ("IC") electrically connected to the circuit patterns and the internal ground wiring lines, a ground layer formed on a second side opposite the first side of the insulating film and connected to the internal ground wiring lines, and via holes formed through the insulating film and electrically connecting the internal ground wiring lines and the ground layer.

24 Claims, 12 Drawing Sheets

MULTI-LAYER FLEXIBLE FILM PACKAGE AND LIQUID CRYSTAL DISPLAY DEVICE INCLUDING THE SAME

This application claims priority to Korean Patent Application No. 10-2006-0072242, filed on Jul. 31, 2006, and all the benefits accruing therefrom under 35 U.S.C. §119, the contents of which in its entirety are herein incorporated by reference.

BACKGROUND OF THE INVENTION

1. Field of the Invention

The present invention relates to a multi-layer flexible film package and a liquid crystal display device including the same, and more particularly, to a multi-layer flexible film package which shields electromagnetic waves, prevents electrostatic discharge, and at the same time, performs a heat radiation function, and a liquid crystal display device including the same.

2. Description of the Related Art

A liquid crystal display ("LCD") device is one of various flat panel displays (FPDs) which are currently widely used. The liquid crystal display device includes two substrates each having electrodes thereon, and a liquid crystal layer interposed between the two substrates. The liquid crystal display device is a display device which adjusts the amount of transmitted light as liquid crystal molecules in the liquid crystal layer are rearranged by applying a voltage to the electrodes on the two substrates.

As a thin film transistor substrate of the two substrates and a printed circuit board ("PCB") are electrically connected to flexible film packages having driver integrated circuits ("ICs") mounted thereon, electrical signals generated from the PCB are transmitted to the thin film transistor substrate through the driver ICs.

However, the driver ICs generate electromagnetic interference ("EMI") and electrostatic discharge ("ESD") due to a plurality of circuit patterns patterned on the flexible film packages. Further, since a considerable amount of heat is radiated to switch the plurality of electrodes at high speed, a liquid crystal panel and the driver ICs may be damaged or image noise may be generated.

Therefore, it is desirable to shield the electromagnetic waves from the flexible film packages having the driver ICs thereon to prevent the ESD, and at the same time, it is desirable to prevent heat radiation.

BRIEF SUMMARY OF THE INVENTION

An aspect of the present invention is to provide a multi-layer flexible film package which shields electromagnetic waves and prevents electrostatic discharge.

Another aspect of the present invention is to provide a liquid crystal display device which shields electromagnetic waves and prevents electrostatic discharge, or performs a heat radiation function.

Still another aspect of the present invention is to provide a liquid crystal display device which shields electromagnetic wave and prevents electrostatic discharge, and at the same time, performs a heat radiation function.

Aspects, features and advantages of the present invention are not limited to those mentioned above, and other aspects of the present invention will be apparently understood by those skilled in the art through the following description.

According to an exemplary embodiment of the present invention, there is provided a multi-layer flexible film package including an insulating film having circuit patterns and internal ground wiring lines at a first side thereof, an insulating layer formed on the circuit patterns and the internal ground wiring lines, a driver integrated circuit ("IC") electrically connected to the circuit patterns and the internal ground wiring lines, a ground layer formed on a second side opposite the first side of the insulating film and connected to the internal ground wiring lines, and via holes formed to pass through the insulating film and electrically connect the internal ground wiring lines and the ground layer.

According to another exemplary embodiment of the present invention, there is provided a liquid crystal display device including a liquid crystal panel having two substrates attached to face each other with a gap therebetween, and a liquid crystal layer interposed in the gap between the two substrates, multi-layer flexible film packages, each of which includes an insulating film which outputs an electrical signal to the liquid crystal panel and has circuit patterns and internal ground wiring lines on a first side thereof, an insulating layer formed on the circuit patterns and the internal ground wiring lines, a driver integrated circuit ("IC") electrically connected to the circuit patterns and the internal ground wiring lines, a ground layer formed on a second side opposite the first side of the insulating film and connected to the internal ground wiring lines, and via holes formed through the insulating film and electrically connecting the internal ground wiring lines to the ground layer, and a top chassis protecting the liquid crystal panel and electrically connected to the ground layers of the multi-layer flexible film packages.

According to still another exemplary embodiment of the present invention, there is provided a liquid crystal display device including a liquid crystal panel having two substrates attached to face each other with a gap therebetween, and a liquid crystal layer interposed in the gap between the two substrates, multi-layer flexible film packages, each of which includes an insulating film which outputs an electrical signal to the liquid crystal panel and has circuit patterns and internal ground wiring lines at a first side thereof, an insulating layer formed on the circuit patterns and the internal ground wiring lines, a driver integrated circuit ("IC") electrically connected to the circuit patterns and the internal ground wiring lines, a ground layer formed on a second side opposite the first side of the insulating film and connected to the internal ground wiring lines, and via holes formed through the insulating film and electrically connecting the internal ground wiring lines and the ground layer, a top chassis protecting the liquid crystal panel, and conductive pads and heat radiating pads formed at the top chassis and in contact with the multi-layer flexible film packages.

BRIEF DESCRIPTION OF THE DRAWINGS

The above and other aspects, features and advantages of the present invention will become more apparent by describing in more detail exemplary embodiments thereof with reference to the attached drawings, in which.

DETAILED DESCRIPTION OF THE INVENTION

Figure 1:
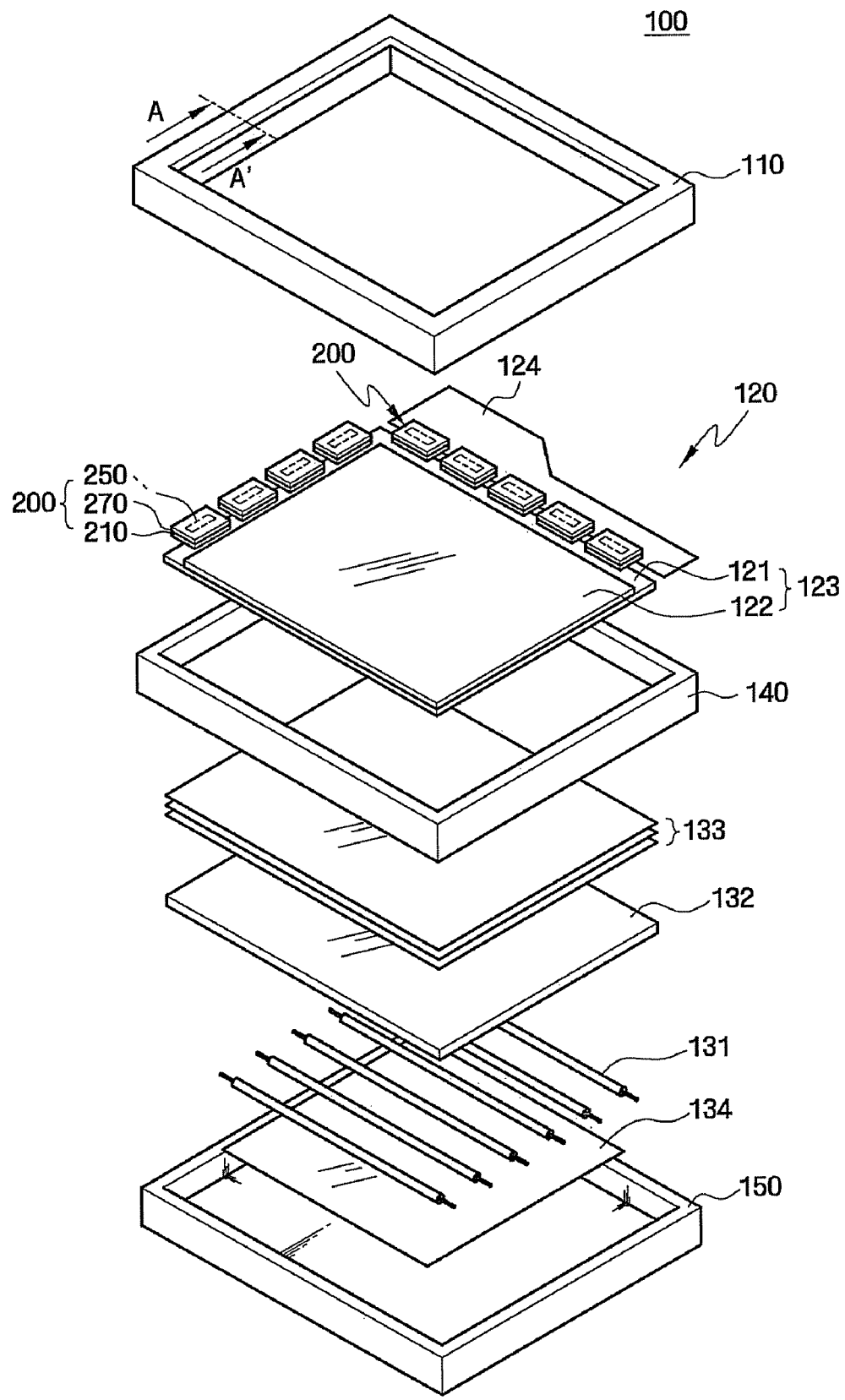
FIG. 1 is an exploded perspective view of a liquid crystal display device according to a first exemplary embodiment of the present invention.

Advantages, aspects and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention will only be defined by the appended claims. Like reference numerals refer to like elements throughout the specification.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

The invention will now be described more fully with reference to the accompanying drawings, in which exemplary embodiments of the present invention are shown.

Figure 2:
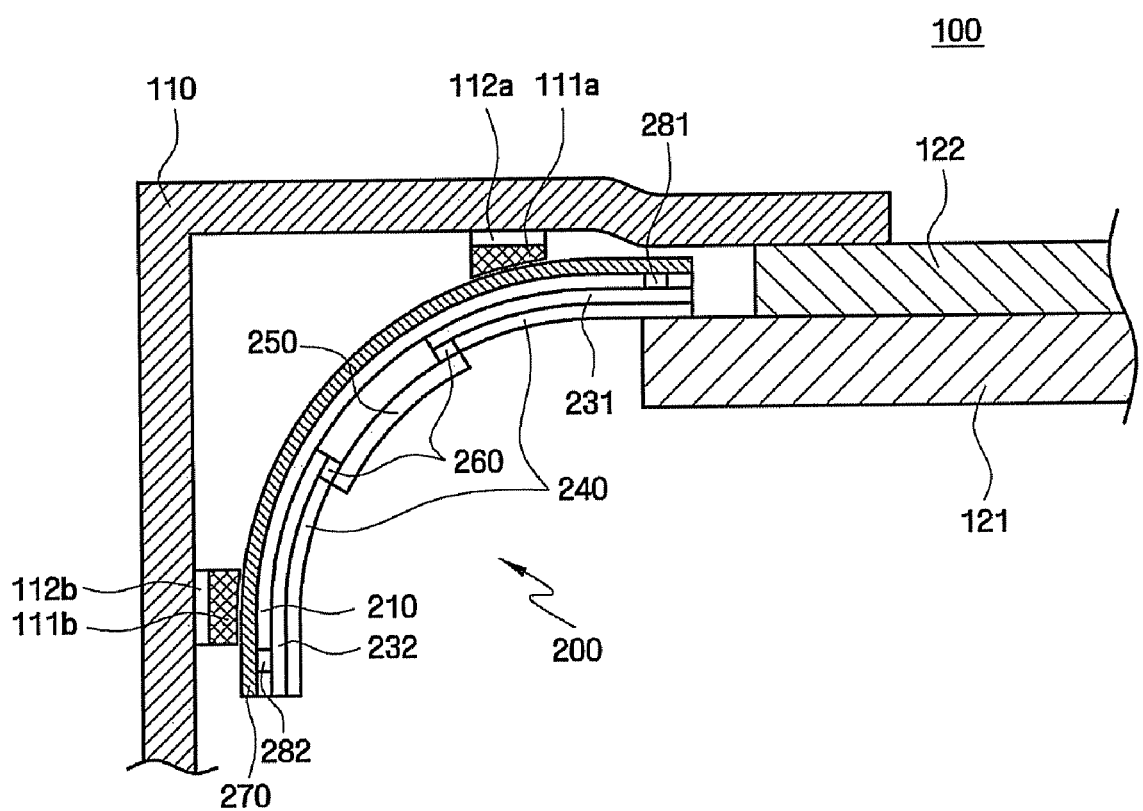
FIG. 2 is a cross-sectional view taken along line A-A' of FIG. 1 partially showing a liquid crystal display device according to the first exemplary embodiment of the present invention.

Referring to FIGS. 1 to 4, a liquid crystal display device according to a first exemplary embodiment of the present invention will be described in more detail. FIG. 1 is an exploded perspective view of a liquid crystal display device according to a first exemplary embodiment of the present invention. FIG. 2 is a cross-sectional view taken along line A-A' of FIG. 1 and partially shows the liquid crystal display device according to the first exemplary embodiment of the present invention.

As shown in FIGS. 1 and 2, a liquid crystal display device 100 according to the first exemplary embodiment of the present invention includes a top chassis 110, a liquid crystal panel assembly 120, lamps 131, a diffusion plate 132, optical sheets 133, a reflective sheet 134, a mold frame 140 and a bottom chassis 150. The liquid crystal panel assembly 120 includes a liquid crystal panel 123 having a thin film transistor substrate 121 and a color filter substrate 122, a printed circuit board 124, and multi-layer flexible film packages 200.

The top chassis 110 protects the liquid crystal panel assembly 120, the lamps 131, the diffusion plate 132, the optical sheets 133 and the reflective sheet 134. Further, the top chassis 110 is placed and fixed onto the bottom chassis 150.

The top chassis 110 includes side walls and upper walls formed along the edge of a rectangular shape, and is electrically connected to ground layers 270 of the multi-layer flexible film packages 200. To do so, the top chassis 110 is formed of a conductive metal material such that the top chassis 110 is grounded to the multi-layer flexible film packages 200 and the like, and discharged.

The liquid crystal display device 100 according to this exemplary embodiment further includes conductive pads 111a and 111b formed at the top chassis 110 and electrically connected to the ground layers 270 of the multi-layer flexible film packages 200 to be described below, as best seen with reference to FIG. 2.

The conductive pads 111a and 111b shield electromagnetic waves, which may be generated from the multi-layer flexible film packages 200, shield electrostatic discharge and prevent image noise.

The conductive pads 111a and 111b are formed of a resilient inner core having a predetermined thickness to ensure that the top chassis 110 is connected to the ground layers 270, and metal-coated cloth covering the resilient inner core such that the conductive pads 111a and 111b have electrical conductivity. Here, the metal may be a material having excellent conductivity, for example, nickel, copper, or the like, and the metal may be coated in a mesh configuration. That is, the surface of the conductive pads 111a and 111b may have a mesh configuration.

The conductive pads 111a and 111b may be attached to an inner surface of the upper walls or an inner surface of the side walls of the top chassis 110 by conductive adhesives 112a and 112b, or may be attached to both the inner surface of the upper walls and the inner surface of the side walls thereof, as illustrated in FIG. 2.

The conductive adhesives 112a and 112b attach the conductive pads 111a and 111b to the top chassis 110 such that the top chassis 110 and the conductive pads 111a and 111b are electrically connected to each other.

The conductive adhesives 112a and 112b may be, for example, conductive double-sided tape, but any shape or material having conductivity can be used for the conductive adhesives 112a and 112b.

The liquid crystal panel assembly 120 includes the liquid crystal panel 123, the printed circuit board 124, and the multi-layer flexible film packages 200 connected to the liquid crystal panel 123.

The liquid crystal panel 123 includes two substrates which are attached to face each other with a gap therebetween, that is, the thin film transistor substrate 121 and the color filer substrate 122, and a liquid crystal layer (not shown) in the gap interposed between the two substrates. The liquid crystal panel 123 receives electrical signals from the printed circuit board 124 and the multi-layer flexible film packages 200 to thereby display a screen image.

Meanwhile, as the printed circuit board 124 included in the liquid crystal display device 100 according to this exemplary embodiment of the present invention is illustrated in FIG. 1, a printed circuit board for a data driving signal which applies an electrical signal to data wiring lines (not shown) on the liquid crystal panel 123 and a printed circuit board for a gate driving signal which applies an electrical signal to gate wiring lines (not shown) on the liquid crystal panel 123 may be arranged. However, for reduction in the weight and thickness of the liquid crystal display device 100, the printed circuit board for a gate driving signal is omitted and the printed circuit board for a data driving signal is used, thereby outputting both the data driving signal and the gate driving signal.

The printed circuit board 124 has mounted thereon various kinds of driving parts which process both the gate driving signal and the data driving signal such that the gate driving signal and the data driving signal are applied to the multi-layer flexible flm packages 200.

The lamps 131 which emit light are disposed in the liquid crystal display device 100. The lamps 131 include, for example, light emitting diodes ("LEDs"), cold cathode fluorescent lamps ("CCFLs"), external electrode fluorescent lamps ("EEFLs"), but are not limited thereto. The lamps 131 are separated or spaced apart from one another at constant intervals and are electrically connected in parallel with one another in the same phase. Further, the lamps 131 may be direct-type lamps (as illustrated in FIG. 1) or edge-type lamps, and are received in the bottom chassis 150.

The diffusion plate 132 is disposed above the lamps 131. The diffusion plate 132 may have a flat panel shape and contains a diffusion material dispersed therein. The diffusion plate 132 makes a luminance of light emitted from the lamps 131 uniform.

A plurality of optical sheets 133 are disposed above the diffusion plate 132. The optical sheets 133 diffuse light transmitted from the lamps 131 and collect light. The optical sheets 133 include a diffusion sheet, a first prism sheet, a second prism sheet, for example, but is not limited thereto.

The reflective sheet 134 is provided below the lamps 131 and has a reflective surface to reflect light upward, which is first emitted downward from the lamps 131.

Since the mold frame 140 has a projection formed along the side walls, the mold frame 140 supports the above-described liquid crystal panel assembly 120 and is received in the bottom chassis 150.

The bottom chassis 150 may have a rectangular shape. Further, the bottom chassis 150 has side walls along the edge of an upper surface thereof, and receives the lamps 131, the diffusion plate 132, the optical sheets 133, the reflective sheet 134 and the mold frame 140 in the side walls.

The bottom chassis 150 can be engaged with the top chassis 110 by a hook coupling (not shown) and/or a screw coupling (not shown). In addition, the coupling between the top chassis 110 and the bottom chassis 150 may be modified into various forms.

The multi-layer flexible film packages 200 included in the liquid crystal display device 100 according to this exemplary embodiment are electrically connected to the printed circuit board 124 and the thin film transistor substrate 121. The multi-layer flexible film packages 200 receive electrical signals from the printed circuit board 124 and output the received electrical signals to the liquid crystal panel 123.

Figure 3:
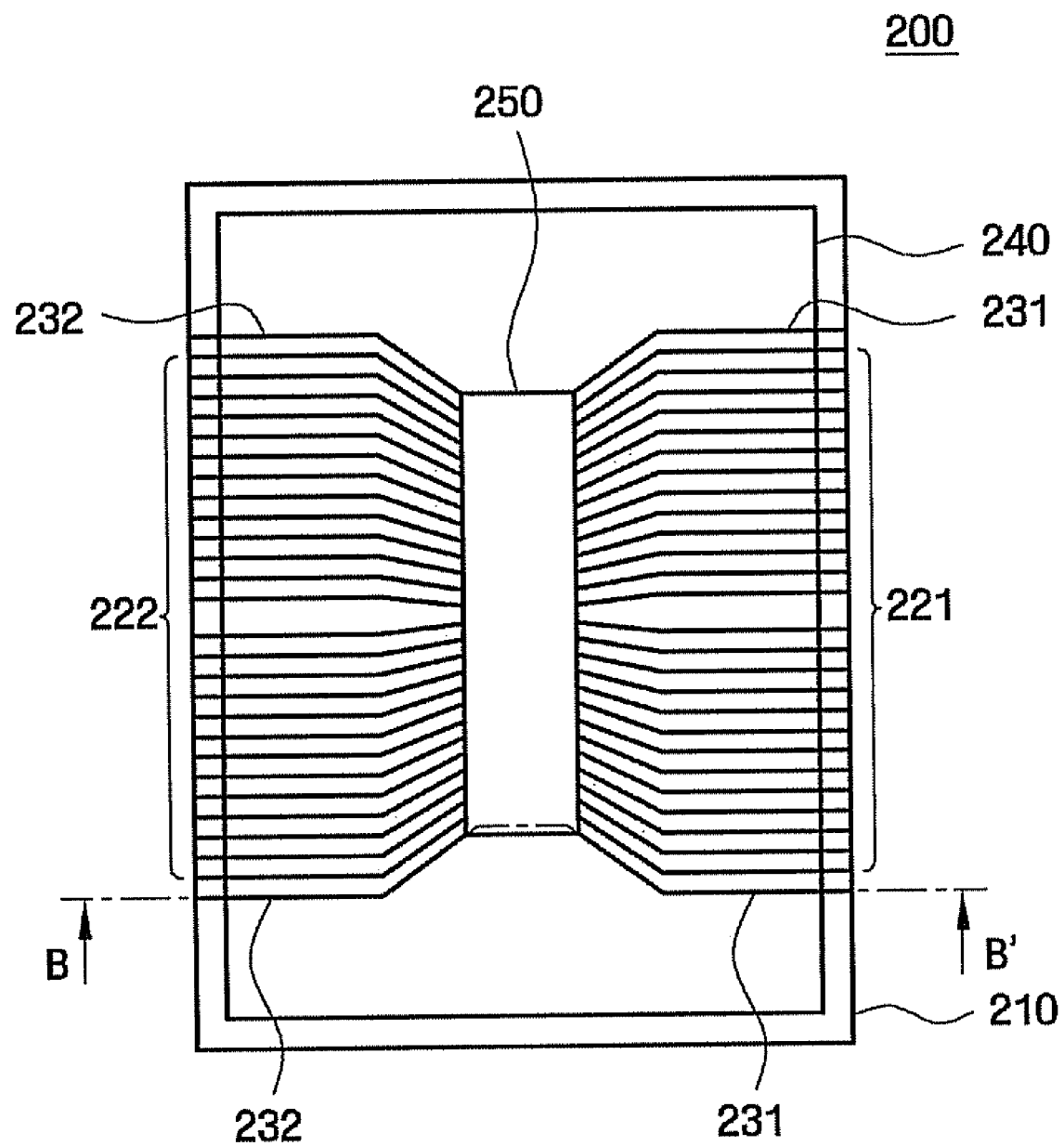
FIG. 3 is a bottom view of a multi-layer flexible film package included in the liquid crystal display device according to the first exemplary embodiment of the present invention.
Figure 4:
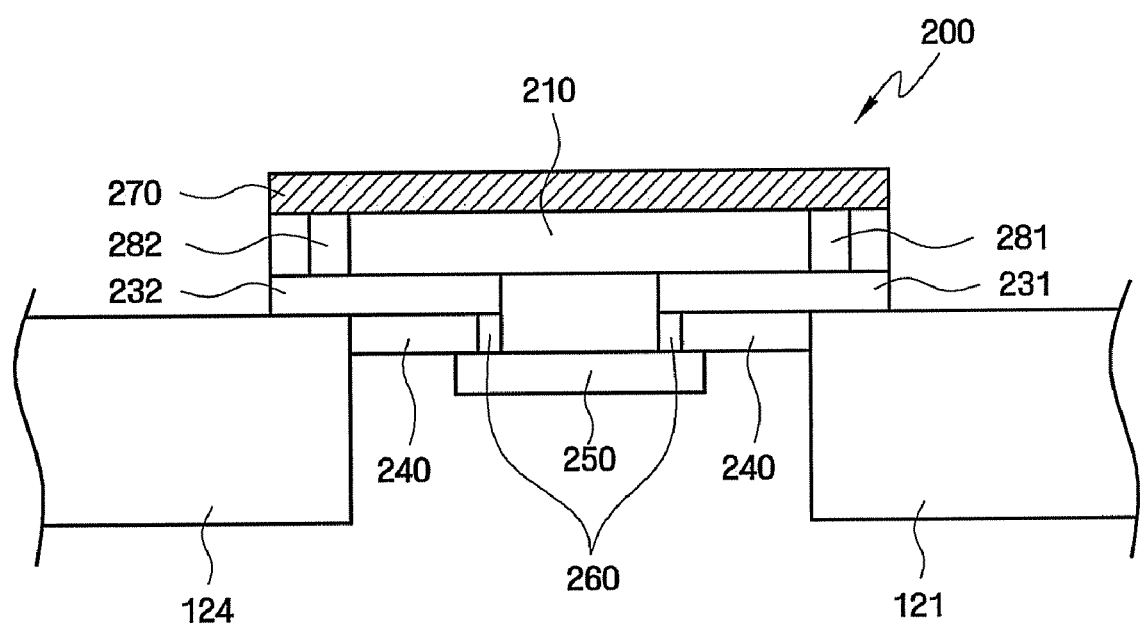
FIG. 4 is a cross-sectional view showing a coupling relationship between the multi-layer flexible film package taken along line B-B' of FIG. 3, and a printed circuit board and a thin film transistor substrate.

Hereinafter, with reference to FIGS. 3 and 4, the multi-layer flexible film packages included in the liquid crystal display device according to the first exemplary embodiment of the present invention will be described in more detail. FIG. 3 is a bottom view of a multi-layer flexible film package 200 included in the liquid crystal display device 100 according to the first exemplary embodiment of the present invention. FIG. 4 is a cross-sectional view showing a coupling relationship between the multi-layer flexible film package 200 taken along line B-B' of FIG. 3, and the printed circuit board 124 and the thin film transistor substrate 121.

The multi-layer flexible film packages 200 may be the data-side multi-layer flexible film package 200 connected to the printed circuit board 124 at an input side thereof or the gate-side multi-layer flexible film package 200 where the printed circuit board 124 is omitted. For the purpose of simplicity, the latter will be described as an example.

The multi-layer flexible film packages 200 according to this exemplary embodiment may a chip on film ("COF") type. In the multi-layer flexible film package 200 of the COF type, a window (refer to reference numeral 390 of FIG. 7) for a driver integrated circuit ("IC") 250 is not formed at an insulating film 210.

The multi-layer flexible film package 200 according to this exemplary embodiment includes the insulating film 210 which has circuit patterns 221 and 222 and internal ground wiring lines 231 and 232 at one side of the insulating film 210, an insulating layer 240 formed on the circuit patterns 221 and 222 and the internal ground wiring lines 231 and 232, the driver IC 250, the ground layer 270 formed on the other side of the insulating film 210 and connected to the internal ground wiring lines 231 and 232, and via holes 281 and 282 which are formed to pass through the insulating film 210 and electrically connect the internal ground wiring lines 231 and 232 to the ground layer 270.

The insulating film 210 is formed of an insulating material having a thin film shape. The plurality of circuit patterns 221 and 222 for outputting electrical signals to the thin film transistor substrate 121 of the liquid crystal panel (refer to reference numeral 123 of FIG. 1) and the internal ground wiring lines 231 and 232 are formed on one side of the insulating film 210.

The circuit patterns 221 and 222 are formed by patterning a conductive material, such as copper, on the one side of the insulating film 210. The circuit patterns 221 and 222 transmit electrical signals, which are applied to the input-side circuit pattern 222 by the printed circuit board 124, to the thin film transistor substrate 121 through the output-side circuit pattern 221.

The internal ground wiring lines 231 and 232 reduce the electromagnetic interference which is generated in the circuit patterns 221 and 222 which transmit a plurality of electrical signals. The internal ground wiring lines 231 and 232 may be formed along an outer edge of the plurality of circuit patterns 221 and 222.

The internal ground wiring lines 231 and 232 may include the input-side internal ground wiring line 232 provided at the printed circuit board 124 side and the output-side internal ground wiring line 231 provided at the thin film transistor substrate 121 side, thereby efficiently shielding electromagnetic waves.

The insulating layer 240 is formed below the circuit patterns 221 and 222 and the internal ground wiring lines 231 and 232 so as to prevent a short circuit thereof and an inflow of a foreign substance, as illustrated in FIG. 4.

The driver IC 250 is provided below the insulating layer 240 and located opposite to the ground layer 270.

The driver IC 250 is electrically connected to the circuit patterns 221 and 222 and the internal ground wiring lines 231 and 232, and controls and transmits electrical signals. In this case, the driver IC 250 can be electrically connected to the internal ground wiring lines 231 and 232 through bumps 260.

The bumps 260 are formed to pass through the insulating layer 240, and electrically connect the driver IC 250 and the internal ground wiring lines 231 and 232 which are opposite to each other with the insulating layer 240 interposed therebetween.

While the above-described driver IC 250 generates electromagnetic interference and electrostatic discharge in response to a plurality of data signals and gate signals, the driver IC 250 also generates heat radiation. In order to prevent these phenomena, the multi-layer flexible film package 200 according to this exemplary embodiment includes the ground layer 270 formed on the other side of the insulating film 210 and connected to the internal ground wiring lines 231 and 232.

The ground layer 270 is formed in the opposite direction to the internal ground wiring lines 231 and 232 with the insulating film 210 interposed therebetween, and is directly connected to the conductive pads 111a and 111b which are attached to the inner surface of the upper walls and/or the inner surface of the side walls of the top chassis 110 (see FIG. 2). Further, the ground layer 270 shields the electromagnetic waves and prevents the electrostatic discharge from the multi-layer flexible film package 200 by securing an excellent return path for the current.

The ground layer 270 may have a larger area than the internal ground wiring lines so as to effectively shield the electromagnetic waves and prevent electrostatic discharge. For example, the ground layer 270 may completely cover the other side of the insulating film 210. In addition, the ground layer 270 may be formed of the same conductive material as the internal ground wiring lines 231 and 232.

The ground layer 270 may be electrically connected to the conductive pads (refer to reference numerals 111a and 111b of FIG. 2) which are attached to the top chassis (refer to reference numeral 110 of FIG. 1). As a result, a better return path for the current may be secured by the internal ground wiring lines 231 and 232 and the ground layer 270, and further, it is possible to more effectively shield the electromagnetic waves and prevent electrostatic discharge.

The ground layer 270 can be electrically connected to the internal ground wiring lines 231 and 232 through the via holes 281 and 282.

The via holes 281 and 282 are formed to pass through the insulating film 210, are formed of a conductive material, and serve as a path through which electromagnetic waves move from the internal ground wiring lines 231 and 232 to the ground layer 270.

In a case of the via holes 281 and 282, it is preferable that there are two via holes at the output-side internal ground wiring line 231 and two via holes at the input-side internal ground wiring line 232 such that the electromagnetic waves can be efficiently removed. However, as long as the via holes 281 and 282 can shield the electromagnetic waves, the via holes 281 and 282 may be formed only at any one of the internal ground wiring lines 231 and 232, or one via hole may be formed at any one or both of the internal ground wiring lines 131 and 232.

According to the liquid crystal display device 100 according to this exemplary embodiment, as the excellent return path is secured by electrically connecting the ground layer 270 to the conductive pads 111a and 111b, it is possible to shield the electromagnetic waves which may be generated when electric signals are transmitted from the multi-layer flexible film package 200 to the liquid crystal panel 123, and to prevent electrostatic discharge.

Figure 5:
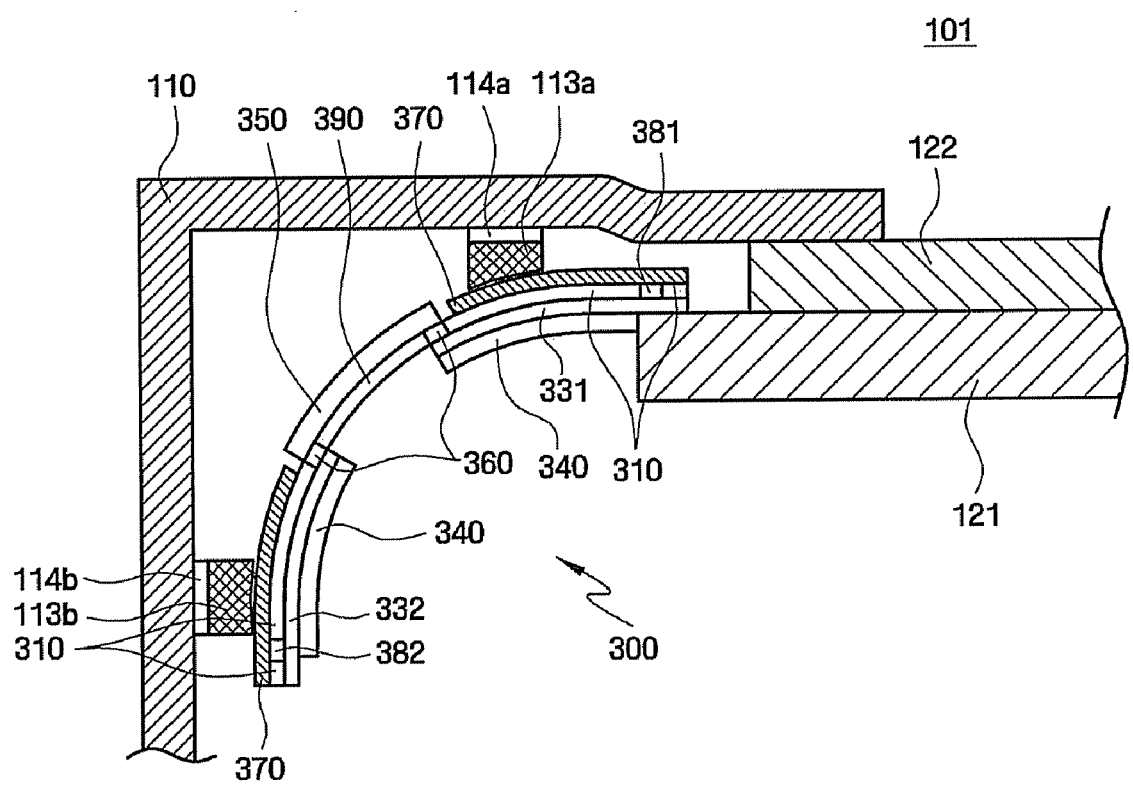
FIG. 5 is a cross-sectional view partially showing a liquid crystal display device according to a second exemplary embodiment of the present invention.
Figure 6:
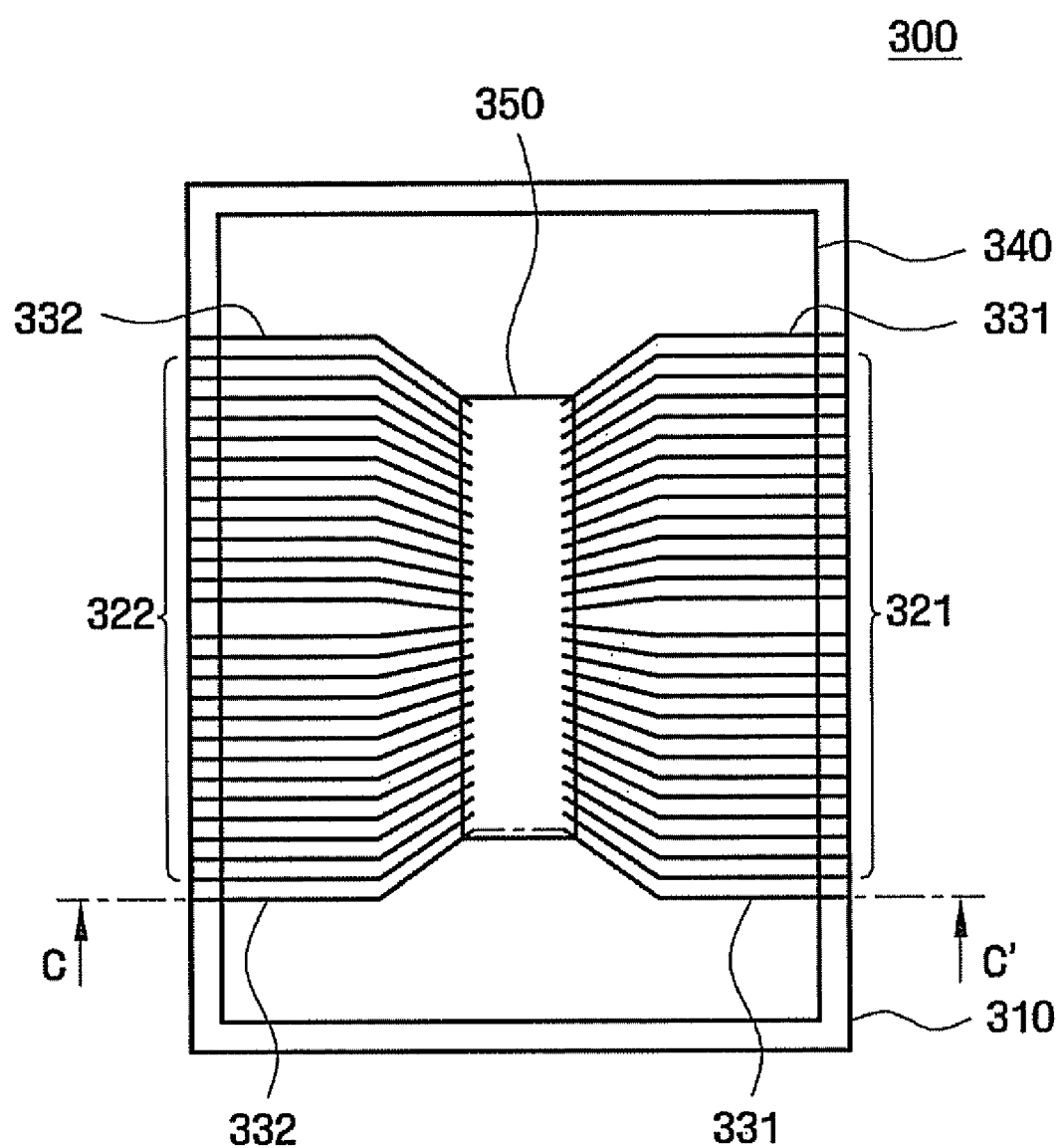
FIG. 6 is a bottom view of a multi-layer flexible film package included in the liquid crystal display device according to the second exemplary embodiment of the present invention.
Figure 7:
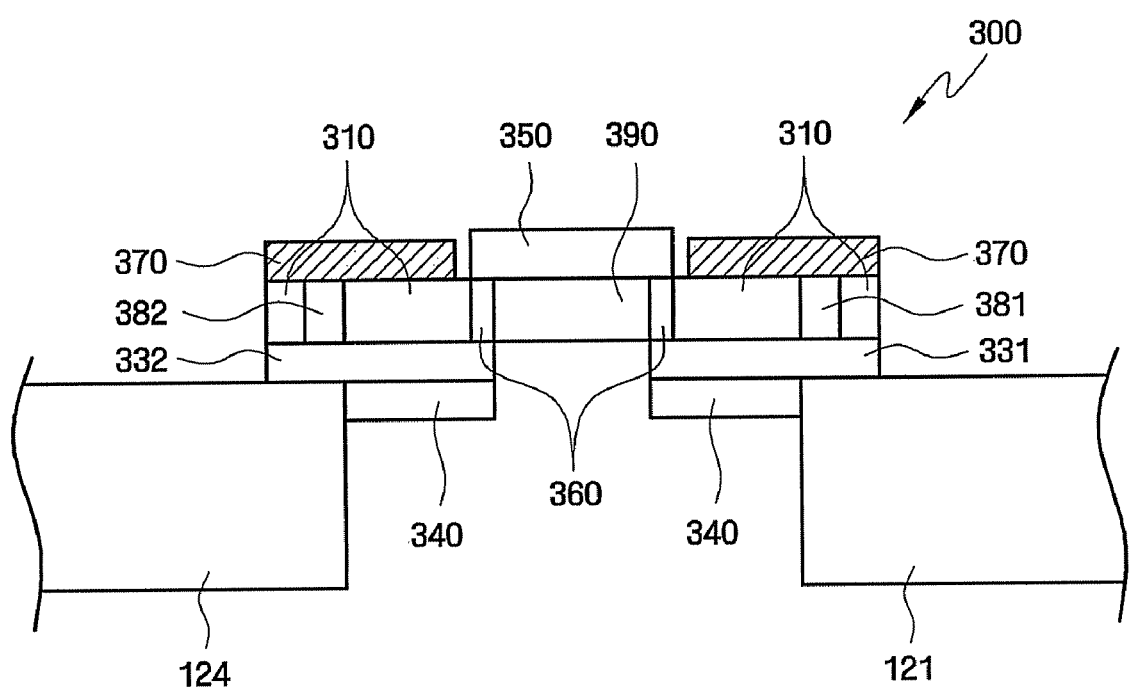
FIG. 7 is a cross-sectional view showing a coupling relationship between the multi-layer flexible film package taken along line C-C' of FIG. 6 and a printed circuit board and a thin film transistor substrate.

Hereinafter, with reference to FIGS. 5 to 7, a liquid crystal display device according to a second exemplary embodiment of the present invention will now be described. FIG. 5 is a cross-sectional view partially showing a liquid crystal display device according to the second exemplary embodiment of the present invention. For convenience of explanation, members having the same functions as the members shown in the above-described first exemplary embodiment are referred to with the same reference numbers, and thus descriptions thereof will be omitted. As shown in FIG. 5, basically, the liquid crystal display device according to this exemplary embodiment has the same structure as the liquid crystal display device 100 of the first exemplary embodiment of the present invention except for the following. That is, a liquid crystal display device 101 according to this exemplary embodiment includes a multi-layer flexible film package 300 according to the second exemplary embodiment of the present invention.

Referring to FIG. 5, the liquid crystal display device 101 according to this exemplary embodiment includes conductive pads 113a and 113b. This second exemplary embodiment is the same as the first exemplary embodiment in that the conductive pads 113a and 113b can be attached to an inner surface of upper walls and/or an inner surface of side walls of a top chassis 110 by conductive adhesives 114a and 114b, respectively.

As the conductive pads 113a and 113b are electrically connected directly to the ground layer 370, it is possible to secure an excellent return path for the current, shield electromagnetic waves and prevent electrostatic discharge.

Hereinafter, referring to FIGS. 6 and 7, the multi-layer flexible film package 300 included in the liquid crystal display device according to the second exemplary embodiment of the present invention will be described. FIG. 6 is a bottom view of the multi-layer flexible film package 300 included in the liquid crystal display device 101 according to the second exemplary embodiment of the invention. FIG. 7 is a cross-sectional view showing the relationship between the multi-layer flexible film package 300 taken along line C-C' of FIG. 6 and a printed circuit board and a thin film transistor substrate.

The multi-layer flexible film package 300 according to this exemplary embodiment is a tape carrier package ("TCP") type, in which a window 390 is formed at an insulating film 310, a driver IC 350 is located at the window 390, and a ground layer 370 is formed at part of the insulating film 310.

Like the multi-layer flexible film package 200 according to the first exemplary embodiment, the multi-layer flexible film package 300 according to this exemplary embodiment includes the insulating film 310 having circuit patterns 321 and 322 and internal ground wiring lines 331 and 332 at one side of the insulating film 310, an insulating layer 340 formed on the circuit patterns 321 and 322 and the internal ground wiring lines 331 and 332, the driver IC 350 connected to the circuit patterns 321 and 322 and the internal ground wiring lines 331 and 332, the ground layer 370 formed on the other side of the insulating film 310 and connected to the internal ground wiring lines 331 and 332, and via holes 381 and 382 formed to pass through the insulating film 310 and electrically connect the internal ground wiring lines 331 and 332 to the ground layer 370. However, the arrangement thereof is different from that of the first exemplary embodiment, as disclosed hereinbelow.

Hereinafter, with emphasis on the difference between the first exemplary embodiment and the second exemplary embodiment, the multi-layer flexible film package 300 according to the second exemplary embodiment will be described. A description of the same parts of the first exemplary embodiment will be omitted or simplified.

The insulating film 310 is formed of an insulating material and has flexibility. However, compared with that of the first exemplary embodiment, the insulating film 310 is stiffer. Further, the insulating film 310 may have a bending line along which the printed circuit board 124 is bent and attached to a rear surface of the bottom chassis 150 (see FIG. 1).

The window 390 is formed at the insulating film 310 in order to mount the driver IC 350 to the window 390.

The driver IC 350 is mounted in the opposite direction to the internal ground wiring lines 331 and 332 with the insulating film 310 interposed therebetween, that is, at the other side of the insulating film 310. The driver 350 is electrically connected to the circuit patterns 321 and 322 and the internal ground wiring lines 331 and 332 through bumps 360 formed on the insulating film 310. That is, the driver IC 350 according to this exemplary embodiment is mounted to the window 390 formed on the other side of the insulating film 310, and the driver IC 350 is formed at the top chassis 110 side. Therefore, the ground layer 370 is formed at the surface of the insulating film 310 except for a mounting part of the driver IC 350.

Like the first exemplary embodiment, the ground layer 370 according to this exemplary embodiment is electrically connected to the internal ground wiring lines 331 and 332 through the via holes 381 and 382.

Like the first embodiment, the via holes 381 and 382 are formed to pass through the insulating film 310 and are formed of a conductive material. The via holes 381 and 382 serve as a path through which electromagnetic waves and the like move from the internal ground wiring lines 331 and 332 to the ground layer 370.

In the case of the via holes 381 and 382, two via holes at the output-side internal ground wiring line 331 and two via holes at the input-side internal ground wiring line 332 may be formed, and some of the via holes 381 and 382 may be omitted, which is the same as described above with respect to the first exemplary embodiment.

Like the first exemplary embodiment, the insulating layer 340 according to this exemplary embodiment is formed to cover the circuit patterns 321 and 322 and the internal ground wiring lines 331 and 332.

Like the first exemplary embodiment, since the liquid crystal display device 101 according to this exemplary embodiment includes the ground layer 370 to thereby secure an excellent return path for the current, it is possible to stabilize electric signals, shield the electromagnetic waves, and prevent electrostatic discharge.

Liquid crystal display devices according to other exemplary embodiments of the present invention will be described. Components of other exemplary embodiments having the same structures as the above-described exemplary embodiments are referred to with the same reference numerals. The overlapping description thereof is omitted or simplified, but a description will be made with emphasis on the differences.

Figure 8:
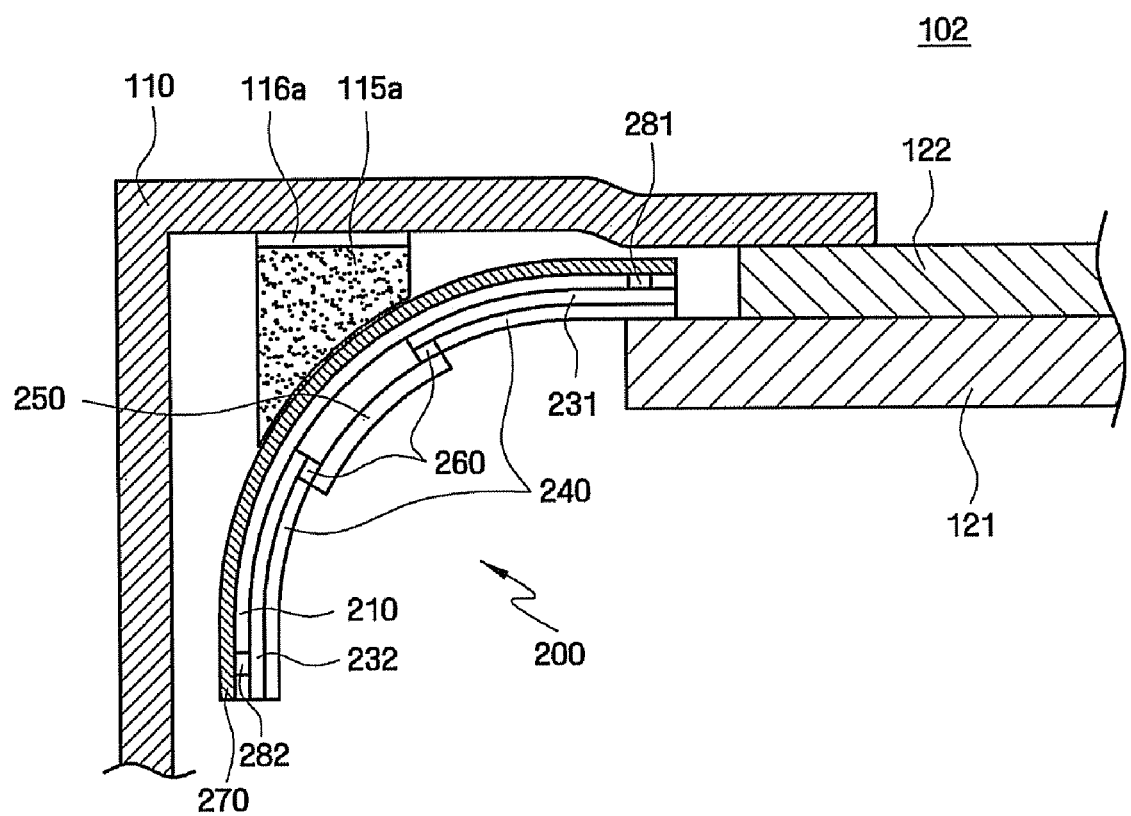
FIG. 8 is a cross-sectional view partially showing a liquid crystal display device according to a third exemplary embodiment of the present invention.

FIG. 8 is a cross-sectional view partially showing a liquid crystal display device according to a third exemplary embodiment of the invention.

A liquid crystal display device 102 according to the third exemplary embodiment includes a heat radiating pad 115a and the multi-layer flexible film package 200 according to the first exemplary embodiment of the invention.

The heat radiating pad 115a is in contact with the ground layer 270 corresponding to the driver IC 250, and radiates heat generated from the driver IC 250. Further, the heat radiating pad 115a absorbs any external impact to thereby protect the multi-layer flexible film package 200 which includes the driver IC 250.

The heat radiating pad 115a is formed of a thermally conductive rubber such that a portion of heat, which is transmitted from the driver IC 250 to the thin film transistor substrate 121, is radiated through the heat radiating pad 115a, and the heat radiating pad 115a absorbs any external impact.

Heat radiation from the driver IC 250 can generate uneven temperature distribution when a temperature of the periphery of the thin film transistor substrate 121 is high and a temperature of the central part thereof is low. As a result, a characteristic of liquid crystal (not shown) changes according to the temperature distribution, and a stain which may be formed on a screen can be prevented by the heat radiating pad 115a to promote even temperature distribution across an area of the thin film transistor substrate 121.

The heat radiating pad 115a may be attached to the inner surface of the upper walls of the top chassis 110 by a heat radiation adhesive 116a.

The heat radiation adhesive 116a may be, for example, a heat conductive double-sided tape, but is not limited thereto as long as the heat radiation adhesive 116a can have thermal conductivity and adhesiveness.

Like the first exemplary embodiment, a ground layer 270 of this exemplary embodiment completely covers the other side of the insulating film 210, and can be electrically connected to the internal ground wiring lines 231 and 232 through the via holes 281 and 282.

Like the first exemplary embodiment, in a case of the via holes 281 and 282, it is preferable that two via holes at the output-side internal ground wiring line 231 and two via holes at the input-side internal ground wiring line 232 be formed, such that electromagnetic waves are efficiently removed. However, as long as the via holes 281 and 282 can shield the electromagnetic waves, the via holes 281 and 282 may only be formed at any one of the internal ground wiring lines 231 and 232, or one via hole may be formed at any one or both of the internal ground wiring lines 231 and 232.

Figure 9:
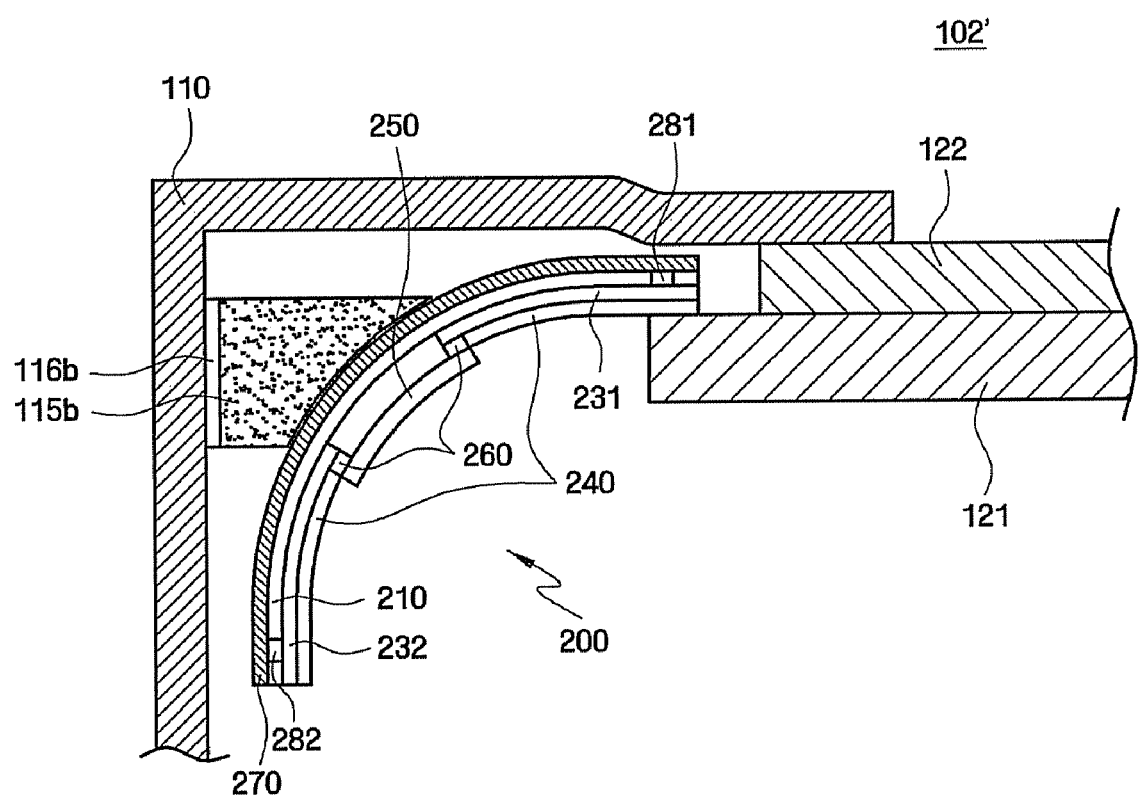
FIG. 9 is a cross-sectional view partially showing a liquid crystal display device according to a modification of the third exemplary embodiment of the present invention.

FIG. 9 is a cross-sectional view partially showing a liquid crystal display device according to a modification of the third exemplary embodiment of the invention.

A liquid crystal display device 102' according to this modification has the same structure as the liquid crystal display device 102 according to the third exemplary embodiment of the present invention, except for the following.

That is, a heat radiating pad 115b according to this modification may be attached to the inner surface of the side walls of the top chassis 110 by the heat radiation adhesive 116b. Though not shown, the heat radiating pad 115b may be a combination of the heat radiating pads 115a and 115b according to the third exemplary embodiment and this modification, and may be formed at both of the inner surface of the upper walls and the inner surface of the side walls of the top chassis 110. In this case, one surface of the heat radiating pads 115a and 115b is covered with the ground layer 270 corresponding to the driver IC 250, and the other surface thereof is connected to the inner surface of the upper walls and the inner surface of the side walls of the top chassis 110. Therefore, it is possible to radiate heat in both directions.

According to the liquid crystal display devices 102 and 102' according to the third exemplary embodiment of the present invention and the modification thereof, as part of the heat generated from the driver IC 250 is radiated by the heat radiating pads 115a and 115b, it is possible to prevent a stain from being produced on the screen due to variable temperature or uneven temperature distribution of the thin film transistor substrate 121.

Figure 10:
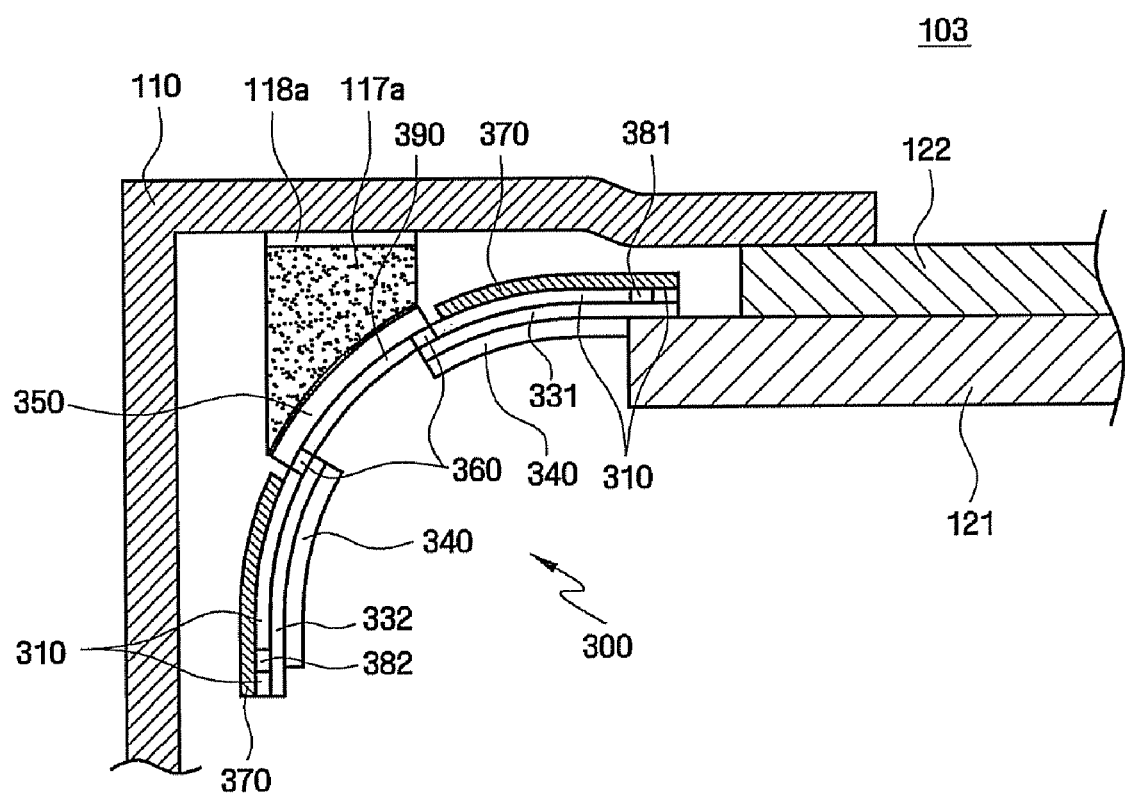
FIG. 10 is a cross-sectional view partially showing a liquid crystal display device according to a fourth exemplary embodiment of the present invention.

FIG. 10 is a cross-sectional view partially showing a liquid crystal display device according to a fourth exemplary embodiment of the present invention.

A liquid crystal display device 103 according to this exemplary embodiment includes a heat radiating pad 117a and the multi-layer flexible film package 300 according to the second exemplary embodiment of the invention.

In the multi-layer flexible film package 300 included in the liquid crystal display device 103 according to this exemplary embodiment, the window 390 is formed at the insulating film 310, and the driver IC 350 is positioned at the window 390. The ground layer 370 covers the surface of the insulating film 310 except for the mounting part of the driver IC 350.

Like the third exemplary embodiment of the present invention, the heat radiating pad 117a of this exemplary embodiment may be attached at the inner surface of the upper walls of the top chassis 110 by a heat radiation adhesive 118a. However, unlike the third exemplary embodiment of the present invention, the heat radiating pad 117a may be directly in contact with the driver IC 350.

Figure 11:
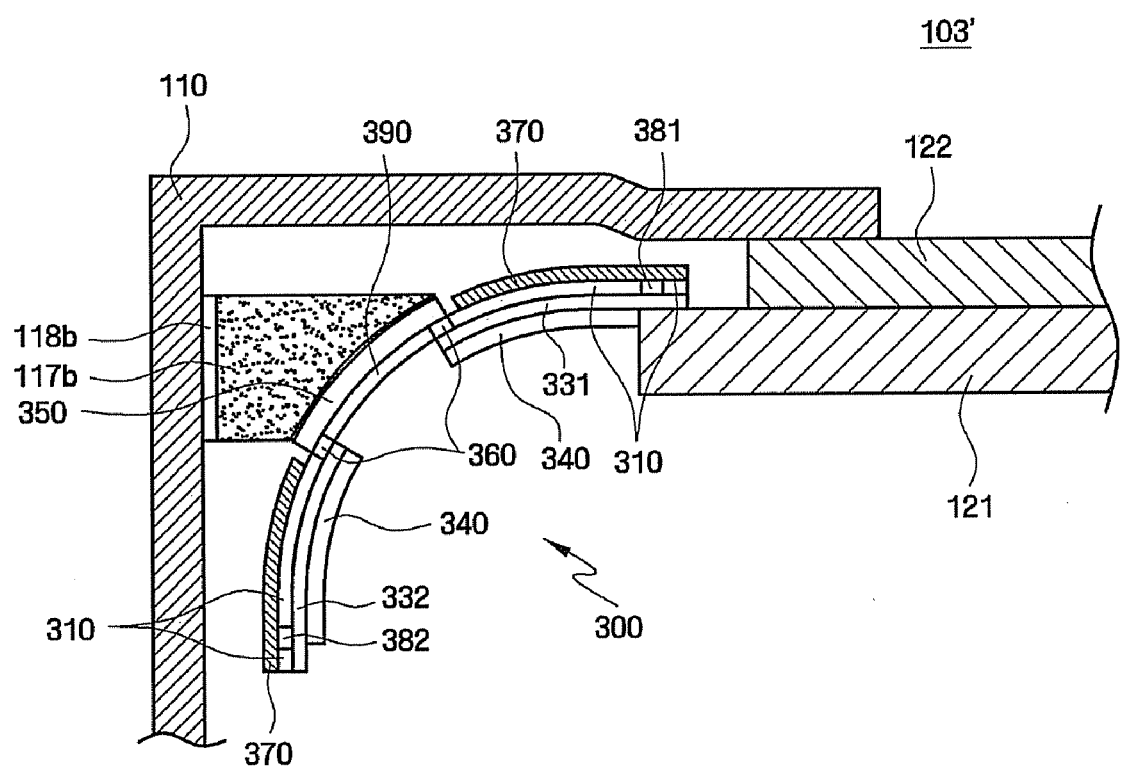
FIG. 11 is a cross-sectional view partially showing a liquid crystal display device according to a modification of the fourth exemplary embodiment of the present invention.

FIG. 11 is a cross-sectional view partially showing a liquid crystal display device according to a modification of the fourth exemplary embodiment of the present invention.

A liquid crystal display device 103' according to this modification has the same structure as the liquid crystal display device 103 according to the fourth exemplary embodiment of the present invention according to the following.

That is, a heat radiating pad 117b according to this modification may be attached to the inner surface of the side walls of the top chassis 110 by the heat radiation adhesive 118b or may be directly in contact with the driver IC 350. Though not shown, the heat radiating pad 117b may be a combination of the heat radiating pads 117a and 117b of the fourth exemplary embodiment and this modification, and may be formed at both of the inner surface of the upper walls and the inner surface of the side walls of the top chassis 110. In this case, one surface of the heat radiating pads 117a and 117b is directly in contact with the driver IC 350, and the other surface thereof is connected to the inner surface of the upper walls and the inner surface of the side walls thereof, respectively. Therefore, it is possible to radiate heat in both directions.

According to the liquid crystal display devices 103 and 103' according to the fourth exemplary embodiment of the present invention and the modification thereof, as part of the heat generated from the driver IC 350 is radiated by the heat radiating pads 117a and 117b, it is possible to prevent a stain from being produced on the screen due to variable temperature or an uneven temperature distribution of the thin film transistor substrate 121.

Figure 12:
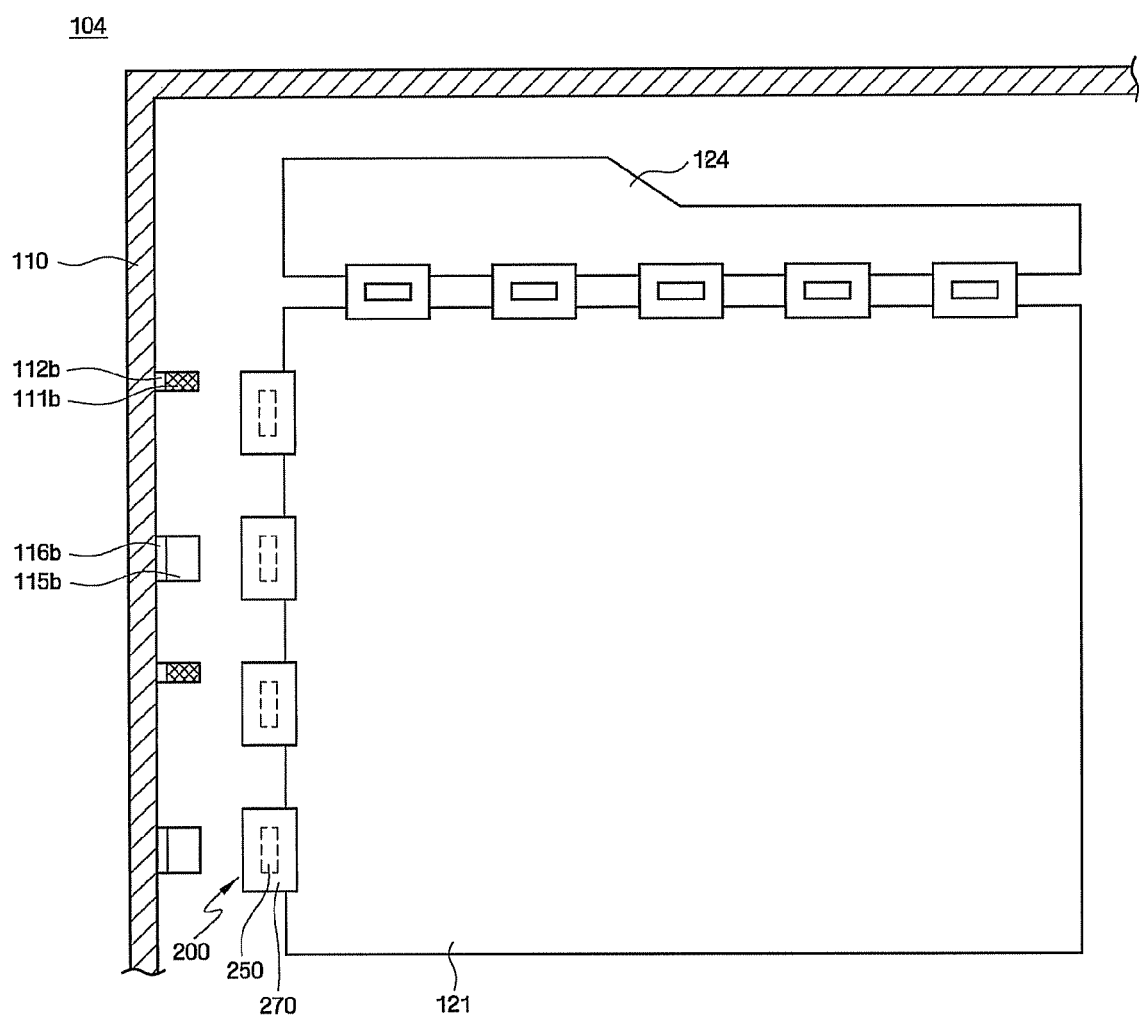
FIG. 12 is a cross-sectional view partially showing a liquid crystal display device according to a fifth exemplary embodiment of the present invention.

FIG. 12 is a cross-sectional view partially showing a liquid crystal display device according to a fifth exemplary embodiment of the present invention.

A liquid crystal display device 104 according to this exemplary embodiment includes the liquid crystal panel (refer to reference numeral 120 of FIG. 1), a plurality of multi-layer flexible film packages 200 or 300 according to the first or the second exemplary embodiments of the invention, a top chassis protecting a liquid crystal panel (refer to reference numeral 110 of FIG. 1), and conductive pads 111b and heat radiating pads 115b which are formed at the top chassis 110 and connected to the multi-layer flexible film packages 200 or 300.

The liquid crystal panel 120 includes a thin film transistor substrate 121 and a color filter substrate (refer to reference numeral 122 of FIG. 1) attached to face each other with a gap therebetween, and a liquid crystal layer in the gap and interposed between the two substrates.

The conductive pads 111b and the heat radiating pads 115b according to this exemplary embodiment are alternately formed on an inner surface of the upper walls and/or an inner surface of the side walls of the top chassis (refer to reference numeral 110 of FIG. 1), and are in contact with the plurality of ground layers 270.

In the liquid crystal display device 104 according to this exemplary embodiment, one group of the plurality of ground layers 270, each of which is formed at each of the plurality of multi-layer flexible film packages 200, may be connected to the conductive pads 111b, and the other group of the plurality of ground layers 270 corresponding to the driver ICs 250 may be covered with the heat radiating pads 115b. In this case, a description is made using the example of when the conductive pad 111b and the heat radiating pad 115b are formed at the inner surface of the side walls of the top chassis 110 by the conductive adhesive 112b and the heat radiation adhesive 116b, respectively. However, the liquid crystal display device 104 is not limited to the conductive pad 111b and the heat radiating pad 115b. Instead, the conductive pad 111a and the heat radiating pad 115a which are connected to the inner surface of the upper walls of the top chassis 110 by the conductive adhesive 112a and the heat radiation adhesive 116a may be used.

In addition, though not shown, in the liquid crystal display 104, one group of the plurality of ground layers 270, each of which is formed at each of the plurality of multi-layer flexible film packages 300 according to the second exemplary embodiment of the present invention, may be connected to the conductive pads 111b, and the driver ICs 250 adjacent to the ground layers 270 of the other group may be directly covered with the heat radiating pads 115b. In this case, the conductive pad 111b and the heat radiating pad 115b may be formed at the inner surface of the side walls of the top chassis 110 by the conductive adhesive 112b and the heat radiation adhesive 116b, respectively. Moreover, the conductive pad 111a and the heat radiating pad 115a may be attached to the inner surface of the upper walls of the top chassis 110 by the conductive adhesive 112a and the heat radiation adhesive 116a.

According to the liquid crystal display device 104 according to this exemplary embodiment, as the conductive pads 111a and 111b and the heat radiating pads 115a and 115b are in contact with the ground layer 270 and the driver IC 250, it is possible to shield electromagnetic waves, prevent electrostatic discharge and perform a heat radiation function.

As described above, according to the multi-layer flexible film packages and the liquid crystal display devices having the same according to the exemplary embodiments of the present invention, the following features, aspects and advantages can be obtained.

First, as the ground layer is formed on the multi-layer flexible film package to thereby secure an excellent return path for the current, it is possible to shield the electromagnetic waves and prevent the electrostatic discharge.

Second, as the conductive pad is electrically connected to the ground layer, it is possible to better shield the electromagnetic waves and prevent the electrostatic discharge.

Third, as the heat radiating pad is in contact with the driver IC or the ground layer corresponding to the driver IC, it is possible to easily remove heat which is generated from the driver IC.

Although the present invention has been described in connection with the exemplary embodiments of the present invention, it will be apparent to those skilled in the art that various modifications and changes may be made thereto without departing from the scope and spirit of the present invention. Therefore, it should be understood that the above exemplary embodiments are not limitative, but illustrative in all aspects.

What is claimed is:

1. A multi-layer flexible film package comprising:
   an insulating film having circuit patterns and internal ground wiring lines at a first side thereof;
   an insulating layer formed on the circuit patterns and the internal ground wiring lines;
   a driver integrated circuit (IC) electrically connected to the circuit patterns and the internal ground wiring lines;
   a ground layer formed on a second side opposite the first side of the insulating film and connected to the internal ground wiring lines; and
   via holes formed to pass through the insulating film and electrically connect the internal ground wiring lines and the ground layer,
   wherein the ground layer comprises a first surface exposed to the outside and a second surface, which is opposite to the first surface and is adjacent to the second side, and
   wherein the ground layer covers a portion of the second side of the insulating film which overlaps the driver IC.

2. The multi-layer flexible film package of claim 1, wherein the driver IC is mounted at the first side of the insulating film.

3. The multi-layer flexible film package of claim 2, wherein the ground layer completely covers the second side of the insulating film.

4. A multi-layer flexible film package comprising:
   an insulating film having circuit patterns and internal ground wiring lines at a first side thereof;
   an insulating layer formed on the circuit patterns and the internal ground wiring lines;
   a driver integrated circuit (IC) electrically connected to the circuit patterns and the internal ground wiring lines;
   a ground layer formed on a second side opposite the first side of the insulating film and connected to the internal ground wiring lines; and
   via holes formed to pass through the insulating film and electrically connect the internal ground wiring lines and the ground layer,
   wherein the ground layer comprises a first surface exposed to the outside and a second surface, which is opposite to the first surface and is adjacent to the second side, and
   wherein a window is formed in the insulating film, and the driver IC is mounted at the window.

5. The multi-layer flexible film package of claim 4, wherein the ground layer covers the second side of the insulating film except for a mounting part of the driver IC of the insulating film.

6. A liquid crystal display device comprising:
   a liquid crystal panel having two substrates attached to face each other with a gap therebetween, and a liquid crystal layer interposed in the gap between the two substrates;
   multi-layer flexible film packages, each of which includes an insulating film which has circuit patterns and internal ground wiring lines at a first side thereof, an insulating layer formed on the circuit patterns and the internal ground wiring lines, a driver integrated circuit (IC) electrically connected to the circuit patterns and the internal ground wiring lines, a ground layer formed on a second side opposite the first side of the insulating film and connected to the internal ground wiring lines, and via holes formed to pass through the insulating film and electrically connect the internal ground wiring lines to the ground layer; and a top chassis protecting the liquid crystal panel and electrically connected to the ground layers of the multi-layer flexible film packages, wherein each multi-layer film package outputs an electrical signal to the liquid crystal panel, and wherein the ground layer comprises a first surface exposed to the outside and a second surface, which is opposite to the first surface and is adjacent to the second side, and wherein the ground layer covers a portion of the second side of the insulating film which overlaps the driver IC.

7. The liquid crystal display device of claim 6, further comprising conductive pads formed at the top chassis and electrically connected to the ground layers.

8. The liquid crystal display device of claim 7, wherein each of the conductive pads has a surface in a mesh configuration and is attached to at least one of an inner surface of upper walls and an inner surface of side walls of the top chassis by a conductive adhesive.

9. The liquid crystal display device of claim 8, wherein the driver IC is mounted at the first side of the insulating film.

10. The liquid crystal display device of claim 9, wherein the ground layer completely covers the second side of the insulating film.

11. The liquid crystal display device of claim 6, further comprising heat radiating pads, each of which is formed at the top chassis and directly in contact with the driver IC or the ground layer corresponding to the driver IC.

12. The liquid crystal display device of claim 11, wherein the heat radiating pad is attached to at least one of an inner surface of upper walls and an inner surface of side walls of the top chassis by a heat radiation adhesive.

13. The liquid crystal display device of claim 12, wherein the heat radiating pad is formed of a thermally conductive rubber.

14. The liquid crystal display device of claim 13, wherein the driver IC is mounted at the first side of the insulating film.

15. The liquid crystal display device of claim 14, wherein the ground layer completely covers the second side of the insulating film.

16. The liquid crystal display device of claim 6, further comprising conductive pads and heat radiating pads formed at the top chassis and in contact with the multi-layer flexible film packages.

17. The liquid crystal display device of claim 16, wherein the conductive pads and the heat radiating pads are alternately formed on at least one of an inner surface of upper walls and an inner surface of side walls of the top chassis, and are connected to the ground layers.

18. The liquid crystal display device of claim 17, wherein a first group of the ground layers is in contact with the conductive pads and a remaining second group of the ground layers corresponding to the driver ICs is covered with the heat radiating pads.

19. A liquid crystal display device comprising:

a liquid crystal panel having two substrates attached to face each other with a gap therebetween, and a liquid crystal layer interposed in the gap between the two substrates;

multi-layer flexible film packages, each of which includes an insulating film which outputs an electrical signal to the liquid crystal panel and has circuit patterns and internal ground wiring lines at a first side thereof, an insulating layer formed on the circuit patterns and the internal ground wiring lines, a driver integrated circuit (IC) electrically connected to the circuit patterns and the internal ground wiring lines, a ground layer formed on a second side opposite the first side of the insulating film and connected to the internal ground wiring lines, and via holes formed to pass through the insulating film and electrically connect the internal ground wiring lines to the ground layer; and a top chassis protecting the liquid crystal panel and electrically connected to the ground layers of the multi-layer flexible film packages, wherein each multi-layer film package outputs an electrical signal to the liquid crystal panel, and wherein the ground layer comprises a first surface exposed to the outside and a second surface, which is opposite to the first surface and is adjacent to the second side, and wherein a window is formed in the insulating film, and the driver IC is mounted at the window.

20. The liquid crystal display device of claim 19, wherein the ground layer covers the second side of the insulating film except for a mounting part of the driver IC of the insulating film.

21. The liquid crystal display device of claim 19, further comprising conductive pads formed at the top chassis and electrically connected to the ground layers.

22. The liquid crystal display device of claim 19, further comprising heat radiating pads, each of which is formed at the top chassis and directly in contact with the driver IC or the ground layer corresponding to the driver IC.

23. The liquid crystal display device of claim 19, further comprising conductive pads and heat radiating pads formed at the top chassis and in contact with the multi-layer flexible film packages.

24. The liquid crystal display device of claim 23, wherein the conductive pads are in contact with a first group of the ground layers, and the heat radiating pads directly cover the driver ICs that are adjacent to the ground layers of a remaining second group.

* * * * *